US011024818B2

(12) United States Patent
King et al.

(10) Patent No.: US 11,024,818 B2
(45) Date of Patent: Jun. 1, 2021

(54) ORGANIC LIGHT-EMITTING DEVICE

(71) Applicants: CAMBRIDGE DISPLAY TECHNOLOGY LIMITED, Godmanchester (GB); SUMITOMO CHEMICAL CO., LTD, Tokyo (JP)

(72) Inventors: Simon King, Godmanchester (GB); David Mohamad, Godmanchester (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 537 days.

(21) Appl. No.: 15/532,891

(22) PCT Filed: Dec. 1, 2015

(86) PCT No.: PCT/GB2015/053668
§ 371 (c)(1),
(2) Date: Jun. 2, 2017

(87) PCT Pub. No.: WO2016/087843
PCT Pub. Date: Jun. 9, 2016

(65) Prior Publication Data
US 2017/0365805 A1 Dec. 21, 2017

(30) Foreign Application Priority Data
Dec. 2, 2014 (GB) ..................................... 1421407

(51) Int. Cl.
| *H01L 51/50* | (2006.01) |
| *H01L 51/54* | (2006.01) |
| *H01L 51/56* | (2006.01) |
| *H01L 51/00* | (2006.01) |
| *C09K 11/06* | (2006.01) |

(52) U.S. Cl.
CPC .......... *H01L 51/5004* (2013.01); *C09K 11/06* (2013.01); *H01L 51/0026* (2013.01); *H01L 51/0039* (2013.01); *H01L 51/0085* (2013.01); *H01L 51/504* (2013.01); *C09K 2211/1044* (2013.01); *C09K 2211/185* (2013.01); *H01L 51/0035* (2013.01); *H01L 51/5016* (2013.01); *H01L 51/5056* (2013.01); *H01L 2251/552* (2013.01)

(58) Field of Classification Search
CPC ........... H01L 2251/552; H01L 51/0085; H01L 51/5016; H01L 51/5004; H01L 51/0026; H01L 51/0039; H01L 51/504; H01L 51/0035; H01L 51/5056; C07F 15/0033; C09K 11/06; C09K 2211/185; C09K 2211/1044
USPC .................... 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS

| 2002/0113545 | A1* | 8/2002 | Adachi | ............... | H01L 51/5016 313/504 |
| 2002/0149010 | A1* | 10/2002 | Wakimoto | .......... | H01L 51/0053 257/40 |
| 2002/0197511 | A1* | 12/2002 | D'Andrade | ......... | H01L 51/5036 428/690 |
| 2004/0062947 | A1* | 4/2004 | Lamansky | .......... | H01L 51/5012 428/690 |
| 2004/0170839 | A1* | 9/2004 | O'Dell | .................... | C08G 61/02 428/421 |
| 2006/0175957 | A1* | 8/2006 | Suzuri | ................. | H01L 51/0067 313/504 |
| 2006/0241202 | A1* | 10/2006 | Wallace | ................. | C08G 61/00 523/1 |
| 2006/0251923 | A1* | 11/2006 | Lin | ..................... | C07F 15/0046 428/690 |
| 2009/0200925 | A1 | 8/2009 | Naito et al. | | |
| 2010/0270916 | A1 | 10/2010 | Xia et al. | | |

(Continued)

FOREIGN PATENT DOCUMENTS

| EP | 2 738 195 A1 | 6/2014 |
| EP | 2746359 A2 | 6/2014 |

(Continued)

OTHER PUBLICATIONS

Klubek et al., "Investigating blue phosphorescent iridium cyclometalated dopant with phenyl-imidazole ligands" Organic Electronics (2014) vol. 15, pp. 3127-3136. (Year: 2014).*

Tsuboyama et al., "Homoleptic Cyclometalated Iridium Complexes with Highly Efficient Red Phosphorescence and Application to Organic Light-Emitting Diode" (2003) vol. 125, Issue 42, pp. 12971-12979. (Year: 2003).*

Ke et al., "Au-ITO Anode for Efficient Polymer Light-Emitting Device Operation" IEEE Photonics Technology Letters (2005) vol. 17, No. 3, pp. 543-545. (Year: 2005).*

(Continued)

*Primary Examiner* — Dylan C Kershner
(74) *Attorney, Agent, or Firm* — Wolf, Greenfield & Sacks, P.C.

(57) ABSTRACT

Organic Light-Emitting Device An organic light-emitting device (100) comprising an anode (103); a cathode (109); a light-emitting layer (107) between the anode and the cathode; and a hole-transporting layer (105) between the anode and the cathode, wherein the light-emitting layer comprises a light-emitting compound of formula (I) and the hole-transporting layer comprises a hole-transporting material having a HOMO level that is no more than 5.1 eV from vacuum level: N N ML x R 2 (R) m (R) n y (I) wherein: R in each occurrence is independently a substituent; $R_2$ is H or a substituent; m is 0, 1 or 2; n is 0, 1, 2, 3 or 4; M is a transition metal; L is a ligand; y is at least 1; and x is 0 or a positive integer.

20 Claims, 2 Drawing Sheets

(56) References Cited

U.S. PATENT DOCUMENTS

| | | | | |
|---|---|---|---|---|
| 2010/0289008 A1* | 11/2010 | Jang | ............... | H01L 51/5052 257/40 |
| 2010/0295026 A1* | 11/2010 | Tsuji | ............... | C09K 11/06 257/40 |
| 2012/0286654 A1* | 11/2012 | Kobayashi | ............... | C07D 471/04 313/504 |
| 2013/0026422 A1* | 1/2013 | Parham | ............... | C07D 471/06 252/500 |
| 2013/0299787 A1* | 11/2013 | Steudel | ............... | H01L 51/504 257/40 |

FOREIGN PATENT DOCUMENTS

| | | | |
|---|---|---|---|
| EP | 2752901 A1 | 7/2014 | |
| JP | 2001-223084 A | 8/2001 | |
| JP | 2004-292782 A | 10/2004 | |
| JP | 2006-083353 A | 3/2006 | |
| JP | 2006-120762 A | 5/2006 | |
| JP | 2007-504342 A | 3/2007 | |
| JP | 2008-542203 A | 11/2008 | |
| JP | 2011-139044 A | 7/2011 | |
| JP | 2013-041990 A | 2/2013 | |
| JP | 2013-523847 A | 6/2013 | |
| JP | 2014-111765 A | 6/2014 | |
| JP | 2014-148663 A | 8/2014 | |
| JP | 2014-167976 A | 9/2014 | |
| WO | WO 02/51206 A2 | 6/2002 | |
| WO | WO 2007/145129 A1 | 12/2007 | |
| WO | WO 2010/028262 A1 | 3/2010 | |
| WO | WO-2010050778 A1 * | 5/2010 | ......... H01L 51/0072 |
| WO | WO 2010/119273 A1 | 10/2010 | |
| WO | WO 2013/031520 A1 | 3/2013 | |

OTHER PUBLICATIONS

Kahn, "Fermi level, work function and vacuum level" Materials Horizons (2016) vol. 3, pp. 7-10. (Year: 2016).*

Jayabharathi et al., "Effect of substituents on the photoluminescence performance of Ir(III) complexes: Synthesis, electrochemistry and photophysical properties" Journal of Photochemistry and Photobiology A: Chemistry, 2009, vol. 208, pp. 13-20. (Year: 2009).*

Merriam-Webster definition of "adjacent", "Adjacent." Merriam-Webster.com. Merriam-Webster, n. d. Web. Sep. 4, 2018) (Year: 2018).*

Combined Search and Examination Report dated Oct. 30, 2015 for Application No. GB1421407.6.

International Search Report and Written Opinion dated Feb. 26, 2016 for Application No. PCT/GB2015/053668.

* cited by examiner

ORGANIC LIGHT-EMITTING DEVICE

RELATED APPLICATIONS

This application is a national stage filing under 35 U.S.C. § 371 of international PCT application, PCT/GB2015/053668, filed Dec. 1, 2015, which claims priority to United Kingdom patent application, GB 1421407.6, filed Dec. 2, 2014, each of which is incorporated herein by reference in its entirety.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

WO 2005/059921 discloses an organic light-emitting device comprising a hole-transporting layer and an electroluminescent layer comprising a host material and a phosphorescent material. High triplet energy level hole-transporting materials are disclosed in order to prevent quenching of phosphorescence.

WO 2010/119273 discloses an organic electroluminescent device having first and second electroluminescent layers including an electroluminescent layer comprising a hole-transporting material and an electroluminescent electron trapping material.

WO 2012/052713 discloses an organic light-emitting device having a charge-transporting layer doped with a light-emitting dopant and a light-emitting layer wherein the colour of light emitted from the device is wherein the x-coordinate value and/or the y-coordinate value of CIE(x,y) coordinates of light emitted from the device is no more than 0.1, and preferably no more than 0.05, from the respective x- or y-coordinate value of a control device in which the charge transporting layer is not doped with a light-emitting dopant.

U.S. Pat. No. 7,772,761 discloses a matching layer on one or both sides of the light-emitting layer of an OLED. The matching layer has an energy similar to that of the emitting material.

US 2009/0200925 discloses an intermediate layer between a hole-transporting layer and a light-emitting layer. The ionization potential of a hole-transport material in the hole transport layer is lower than the ionization potential of a material of the intermediate layer. The ionization potential of the material of the intermediate layer is higher than the ionization potential of a dopant in the light-emitting layer.

U.S. Pat. No. 6,603,150 discloses an organic light-emitting device having a hole-transporting layer, an interface layer, a light-emitting layer and an electron-transporting layer between the anode and the cathode.

SUMMARY OF THE INVENTION

In a first aspect the invention provides an organic light-emitting device comprising an anode; a cathode; a light-emitting layer between the anode and the cathode; and a hole-transporting layer between the anode and the cathode, wherein the light-emitting layer comprises a light-emitting compound of formula (I) and the hole-transporting layer comprises a hole-transporting material having a HOMO level that is no more than 5.1 eV from vacuum level:

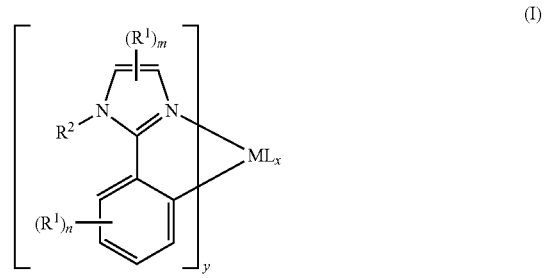

(I)

wherein:
$R^1$ in each occurrence is independently a substituent;
$R^2$ is H or a substituent;
m is 0, 1 or 2
n is 0, 1, 2, 3 or 4;
M is a transition metal;
L is a ligand;
y is at least 1; and
x is 0 or a positive integer.

In a second aspect the invention provide a method of forming an organic light-emitting device according to the first aspect, the method comprising the steps of forming the hole-transporting layer over the anode; forming the first light-emitting layer over the hole-transporting layer; and forming the cathode over the first light-emitting layer.

DESCRIPTION OF THE DRAWINGS

The invention will now be described in more detail with reference to the drawings in which.

DETAILED DESCRIPTION OF THE INVENTION

Figure 1:
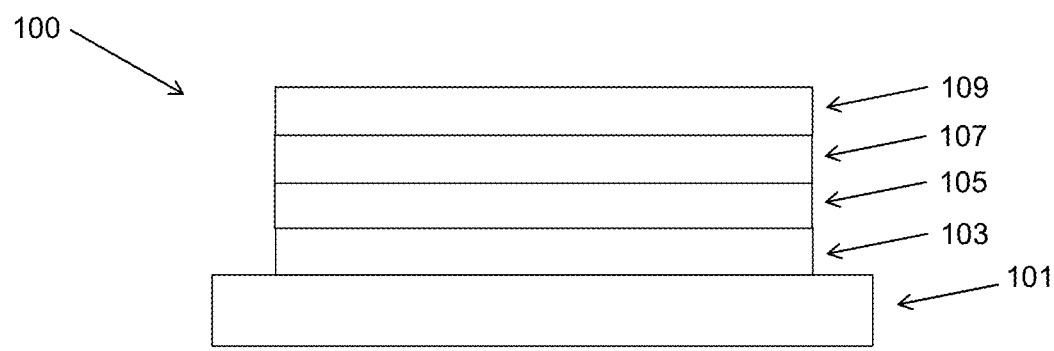
FIG. 1 illustrates schematically an OLED according to an embodiment of the invention.

FIG. 1, which is not drawn to any scale, illustrates an OLED 100 according to an embodiment of the invention supported on a substrate 101, for example a glass or plastic substrate. The OLED 100 comprises an anode 103, a hole-transporting layer 105, a first light-emitting layer 107 and a cathode 109.

The hole-transporting layer 105 contains a hole-transporting material having a HOMO level of no more than 5.1 eV or no more than 5.0 eV and optionally less than 5.0 eV ("no more than" as used herein with respect to a HOMO or LUMO level or a work function means "no further from vacuum than" and "less than" as used herein with respect to a HOMO or LUMO level or a work function means "closer to vacuum than").

First light-emitting layer 107 comprises a phosphorescent light-emitting material of formula (I) and may comprise one or more further light-emitting materials. Preferably, first light-emitting layer 107 comprises the first light-emitting material and at least one further light-emitting material that produces light during operation of the device 100. The HOMO of the compound of formula (I) may be closer to vacuum than the HOMO level of the hole-transporting material. Preferably, the compound of formula (I) has a HOMO level that is no more than 0.1 eV closer to vacuum than that of the hole-transporting material.

The compound of formula (I) is a phosphorescent light-emitting material. Preferably, any further light-emitting material of the first light-emitting layer 107 is a phosphorescent material.

The or each phosphorescent material of the first light-emitting layer 107 may be doped in a host material, suitably an electron-transporting host material.

The hole-transporting layer 105 may consist essentially of the hole-transporting material or it may contain one or more further materials. The hole-transporting layer 105 may contain a fluorescent or phosphorescent light-emitting material that emits light when the device is in operation, in which case the hole-transporting layer is a second light-emitting layer.

In the case where the hole-transporting layer comprises a light-emitting material, the light-emitting material preferably has a longer peak wavelength than the compound of formula (I).

Preferably, substantially all light emitted by the device is from the light-emitting material or materials of the first light-emitting layer only or, if the hole-transporting layer contains a further light-emitting material, from the first light-emitting layer 107 and the hole-transporting layer 105. Preferably, substantially all light emitted by the device is phosphorescence.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm A blue light-emitting material may have a photoluminescence spectrum with a peak in the range of up to about 490 nm, optionally about 450-490 nm.

The photoluminescence spectrum of a light-emitting material may be measured by casting 5 wt % of the material in a polystyrene film onto a quartz substrate and measuring in a nitrogen environment using apparatus C9920-02 supplied by Hamamatsu.

Preferably, the light-emitting material of hole-transporting layer 105, if present, is a red light-emitting material.

Preferably, the compound of formula (I) is a blue phosphorescent material.

The OLED 100 may be a white-emitting OLED wherein light emitted from the hole-transporting light-emitting layer 105, in the case where this layer contains a further emitter, and the first light-emitting layer 107 combine to produce white light. White light may be produced from a combination of red, green and blue light-emitting materials.

White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K.

In one arrangement, light-emitting layer 107 contains red, green and blue phosphorescent materials that in operation produce white light.

In another arrangement, first light-emitting layer 107 contains a blue phosphorescent compound of formula (I) and a green phosphorescent compound, and the hole-transporting layer 105 contains a red phosphorescent compound.

The OLED 100 may contain one or more further layers between the anode 103 and the cathode 109, for example one or more charge-transporting, charge-blocking or charge-injecting layers. Preferably, the device comprises a conductive hole-injection layer between the anode and the hole-transporting layer 105.

Preferably, the hole-transporting layer 105 is the semiconducting layer of device 100 that is closest to the anode. Preferably, no further hole-transporting layer is provided between the hole-transporting layer 105 and the anode. The hole-transporting layer 105 may be adjacent to the anode or, if a hole-injection layer is present, adjacent to the hole-injection layer.

"Conducting material" as used herein means a material having a work function, for example a metal or a degenerate semiconductor.

"Semiconducting material" as used herein means a material having a HOMO and a LUMO level, and a semiconductor layer is a layer comprising a semiconducting material or consisting of one or more semiconducting materials.

Preferably, the hole-transporting layer 105 is adjacent to the first light-emitting layer 107. The triplet energy level of the hole-transporting material $T_1$ HT in the hole-transporting layer 105 is preferably no more than 0.1 eV lower than, and is preferably about the same as or higher than, the lowest triplet excited state energy level of the compound of formula (I).

The hole-transporting layer 107 may have a thickness in the region of about 5-50 nm, preferably about 10-40 nm.

In operation, holes are injected from anode 103 into the hole-transporting layer 105 and first light-emitting layer 107.

Electrons are injected from cathode 109 into the first light-emitting layer 107 and into the hole-transporting layer 105.

Holes and electrons recombine in the first light-emitting layer 107, and in the hole-transporting layer 105 if a second light-emitting material is present, to produce excitons that undergo radiative decay to produce fluorescence or phosphorescence. Excitons, in particular triplet excitons, formed in one of the hole-transporting layer and first light-emitting layer 105 and 107 may migrate into the other of the hole-transporting layer and first light-emitting layers 105 and 107 and may be absorbed by a light-emitting material in that layer.

Triplet energy levels as described anywhere herein may be measured from the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

Triplet energy levels of phosphorescent materials, including the compound of formula (I), may be measured from their room temperature phosphorescence spectra.

Compounds of formula (I)

m of the compound of formula (I) may be 0, 1 or 2.

n of the compound of formula (I) may be 0, 1, 2 or 3.

In the case where one or both of m and n is not 0, $R^1$ may be selected from the group consisting of $C_{1-30}$ hydrocarbyl groups, preferably $C_{1-20}$ alkyl; unsubstituted phenyl; and phenyl substituted with one or more $C_{1-10}$ alkyl groups.

$R^2$ is preferably a substituent. Exemplary groups $R^2$ are $C_{1-30}$ hydrocarbyl groups, preferably $C_{1-20}$ alkyl; unsubstituted phenyl or biphenyl; and phenyl or biphenyl substituted with one or more $C_{1-10}$ alkyl groups.

In the case where $R^2$ is an aromatic group, for example a phenyl or biphenyl group, the phenyl or biphenyl group is preferably substituted, for example substituted with a $C_{1-10}$ alkyl groups, at one or both positions adjacent to the carbon atom linking the aromatic group to the phenylimidazole group. The aromatic group may or may not be substituted with one or more further substituents.

M may be selected from d-block metal cations of rows 2 and 3 i.e. elements 39 to 48 and 72 to 80, and is preferably a cation of ruthenium, rhodium, palladium, rhenium, osmium, iridium, platinum and gold. Preferably, M is $Ir^{3+}$.

Where present, L may be selected from any ligand other than ligands of formula:

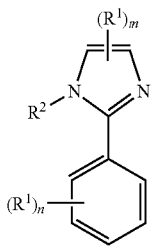

Exemplary ligands L include O,O-bidentate ligands, optionally diketonate ligands, for example acac.

In one preferred embodiment, x is 0 in which case y is preferably 2 or 3.

In another case, x is 1 or 2 and y is 1 or 2.

Exemplary compounds of formula (I) include the following, each of which may be unsubstituted or substituted with one or more substituents, optionally one or more C1-10 alkyl groups:

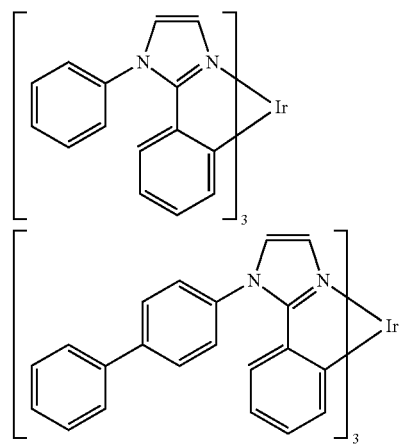

Hole-Transporting Materials

The hole-transporting material of the hole-transporting layer may be a polymeric or non-polymeric material.

The hole-transporting material may be a non-polymeric compound of formula (III):

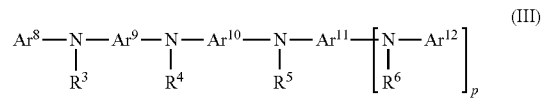

(III)

wherein $Ar^8$, $Ar^9$, $Ar^{10}$, $Ar^{11}$ and $Ar^{12}$ in each occurrence are independently selected from substituted or unsubstituted aryl or heteroaryl, each of which may independently be unsubstituted or substituted with one or more substituents; $R^3$, $R^4$, $R^5$ and $R^6$ are each independently a substituent, optionally an aryl or heteroaryl group $Ar^{13}$; p is 0 or a positive integer, preferably 0 or 1; and any two aromatic or heteroaromatic groups selected from $Ar^8$, $Ar^9$, $Ar^{10}$, $Ar^{11}$, $Ar^{12}$ and $Ar^{13}$ directly bound to the same N atom may be linked by a direct bond or a divalent linking atom or group.

Preferred divalent linking atoms and groups include O, S; $NR^6$; and $CR^6_2$ wherein $R^6$ independently in each occurrence is a substituent. Preferably, the divalent linking group is $CR^6_2$. Preferably, $R^6$ is a $C_{1-40}$ hydrocarbyl group, optionally a hydrocarbyl group selected from $C_{1-20}$ alkyl, unsubstituted phenyl and phenyl substituted with one or more $C_{1-20}$ alkyl groups.

$Ar^8$, $Ar^9$, $Ar^{10}$, $Ar^{11}$ and $Ar^{12}$ are preferably an aryl group, more preferably phenyl or fluorene that may be unsubstituted or substituted with one or more substituents.

$R^3$, $R^4$, $R^5$ and $R^6$ may each independently selected from an aryl or heteroaryl group $Ar^{13}$ that may be unsubstituted or substituted with one or more substituents; a branched or linear chain of $Ar^{13}$ groups; a $C_{1-20}$ alkyl group wherein one or more non-adjacent C atoms of the $C_{1-20}$ alkyl group may be replaced with O, S, —C(=O)— or —C(=O)O— and one or more H atoms of the $C_{1-20}$ alkyl group may be replaced with F; a $C_{1-20}$ alkyl-phenyl group wherein one or more non-adjacent C atoms of the $C_{1-20}$ alkyl group may be replaced with O, S, —C(=O)— or —C(=O)O— and one or more H atoms of the $C_{1-20}$ alkyl group may be replaced with F; and a crosslinkable unit that is bound directly to the N atom of formula (III) or spaced apart therefrom by a spacer group. Exemplary spacer groups are $C_{1-20}$ alkyl, phenyl and phenyl-$C_{1-20}$ alkyl.

Exemplary crosslinkable groups are groups of formulae (XII) and (XII) and (XIV):

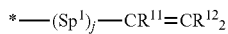

(XII)

(XIII)

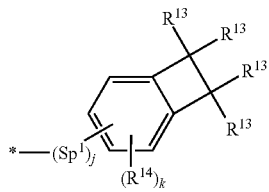

(XIV)

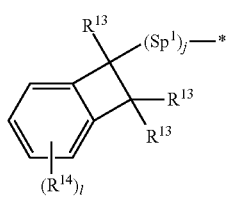

wherein $R^{11}$ and $R^{12}$ in each occurrence is independently H or a substituent, more preferably H or $C_{1-10}$ alkyl, and each $R^{12}$ is preferably H; $R^{13}$ and $R^{14}$ independently in each occurrence is H or a substituent, optionally H, $C_{1-10}$ alkyl or $C_{1-10}$ alkoxy; $Sp^1$ is a spacer group; j is 0 or 1; k is 0, 1, 2 or 3; l is 0, 1, 2, 3 or 4; Sp is a spacer group, optionally $C_{1-20}$ alkyl, phenyl or phenyl-$C_{1-20}$ alkyl; and * represents a bond to N of formula (III).

Exemplary groups $R^3$, $R^4$, $R^5$ and $R^6$ include the following, each of which may be unsubstituted or substituted with one or more substituents, and wherein * represents a point of attachment to N:

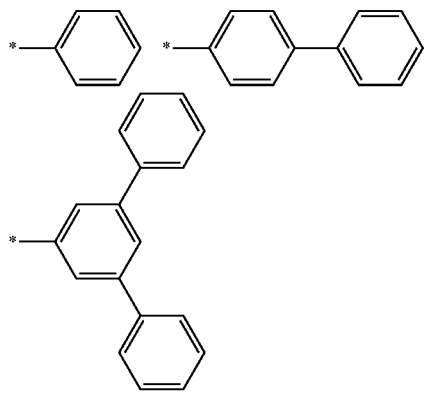

$R^3$, $R^4$, $R^5$ and $R^6$ are each preferably an aryl or heteroaryl group $Ar^{12}$, more preferably phenyl that may be unsubstituted or substituted with one or more substituents, or a $C_{1-20}$ alkyl group.

Optionally, $Ar^9$ and $Ar^{10}$ are linked by a divalent group, more preferably a group of formula $CR^6_2$.

$Ar^8$, $Ar^9$, $Ar^{10}$, $Ar^{11}$, $Ar^{12}$ and $Ar^{13}$ are each independently unsubstituted or substituted with one or more, optionally 1, 2, 3, 4, or 5 groups $R^{18}$ wherein $R^{18}$ in each occurrence is independently a substituent. Optionally, each $R^{18}$ is independently selected from the group consisting of: phenyl that may be unsubstituted or substituted with one or more $C_{1-10}$ alkyl groups; substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F; and a crosslinkable group.

Exemplary non-polymeric compounds of formula (III) include compounds of formula (III-1):

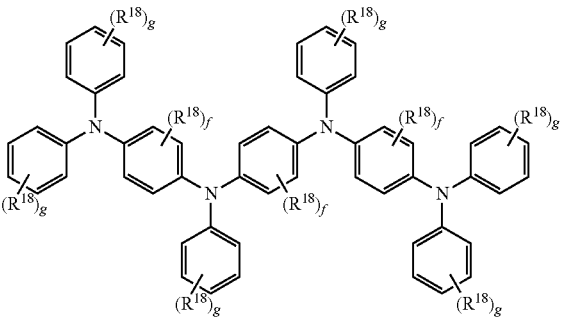

(III-1)

wherein $R^{18}$ in each occurrence is a substituent as described above; each f is independently 0, 1, 2, 3 or 4; each g is independently 0, 1, 2, 3, 4 or 5; and in the case where g of a group —$(R^{18})_g$ is at least 2, two groups $R^{18}$ of the group —$(R^{18})_g$ may be linked to form an unsubstituted or substituted ring system.

Preferably, f in each occurrence is 0.

Preferably, g in each occurrence is independently 0, 1, 2 or 3.

Optionally, $R^{18}$ is independently in each occurrence a $C_{1-20}$ alkyl; unsubstituted phenyl; or phenyl substituted with one or more $C_{1-10}$ alkyl groups.

Two groups $R^{18}$ bound to the same phenyl ring may be linked to form an unsubstituted or substituted fluorene group with the phenyl ring.

Exemplary compounds of formula (III-1) include the following:

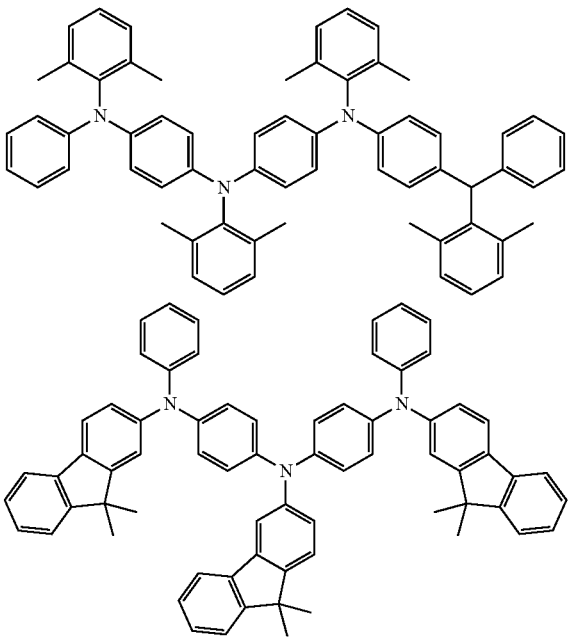

-continued

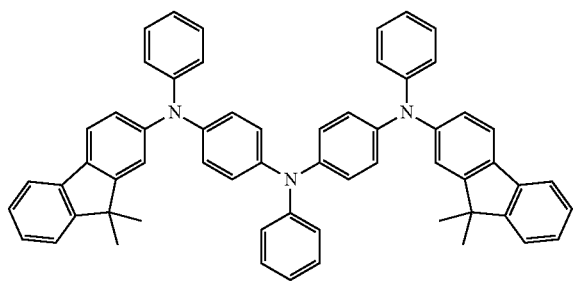

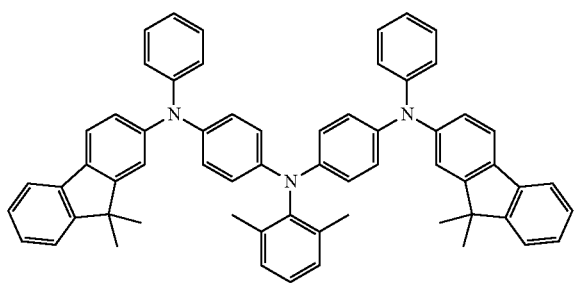

The hole-transporting material may be a non-conjugated or conjugated polymer. The hole-transporting polymer may comprise repeat units comprising a group of formula (III). Groups of formula (III) may be provided in a backbone of the polymer, as side-chain groups of a polymer or as end-groups of a polymer.

Preferably, the hole-transporting material is a conjugated polymer.

Preferably, the hole-transporting material is a polymer comprising repeat units of formula (III-2):

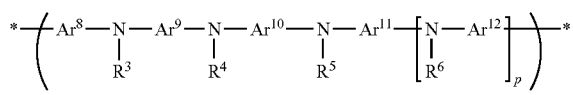

(III-2)

wherein $Ar^8$, $Ar^9$, $Ar^{10}$, $Ar^{11}$, $Ar^{12}$, $Ar^{13}$, $R^3$, $R^4$, $R^5$, $R^6$ and p are as described with reference to formula (III). Exemplary repeat units of formula (III-2) include the following:

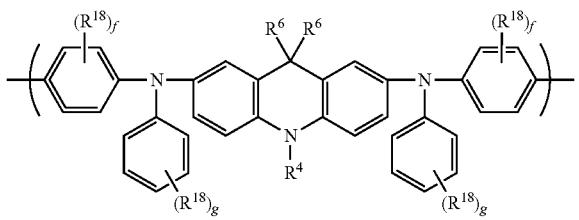

-continued

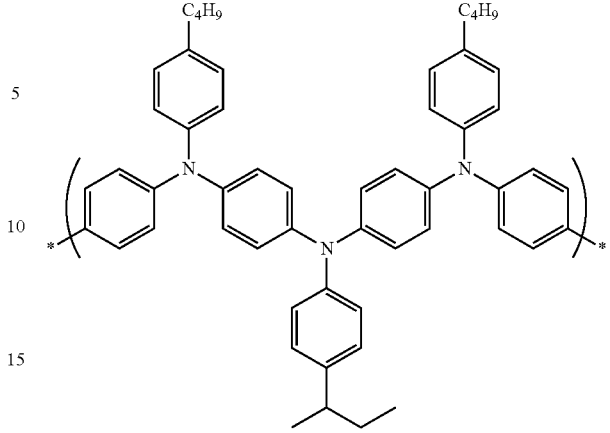

wherein f, g, $R^4$, $R^6$ and $R^{18}$ are as described above.

A hole-transporting polymer comprising repeat units of formula (III-2) may be a homopolymer or a copolymer containing repeat units of formula (III-2) and one or more co-repeat units.

In the case of a copolymer, repeat units of formula (III-2) may be provided in a molar amount in the range of about 20-99 mol %, optionally about 20-50 mol %.

Exemplary co-repeat units include arylene repeat units that may be unsubstituted or substituted with one or more substituents, for example one or more $C_{1-40}$ hydrocarbyl groups.

Exemplary arylene co-repeat units include 1,2-, 1,3- and 1,4-phenylene repeat units, 3,6- and 2,7-linked fluorene repeat units, indenofluorene, 1,4-linked naphthalene; 2,6-linked naphthalene, 9,10-linked anthracene; 2,6-linked anthracene; phenanthrene, for example 2,7-linked phenanthrene repeat units, each of which may be unsubstituted or substituted with one or more substitutents, for example one or more $C_{1-40}$ hydrocarbyl substituents.

Linking positions and/or substituents of arylene co-repeat units may be used to alter the $T_1$ level of a hole-transporting polymer by controlling the extent of conjugation of the hole-transporting polymer.

Substituents may be provided adjacent to one or both linking positions of an arylene co-repeat unit to create steric hindrance with adjacent repeat units, resulting in twisting of the arylene co-repeat unit out of the plane of the adjacent repeat unit.

A twisting repeat unit may have formula (II):

(II)

wherein $Ar^1$ is an arylene group; $R^7$ in each occurrence is a substituent; and p is 0 or 1. The one or two substituents $R^7$ may be the only substituents of repeat units of formula (I), or one or more further substituents may be present, optionally one or more $C_{1-40}$ hydrocarbyl groups.

The one or two substituents $R^7$ adjacent to the linking positions of formula (II) create steric hindrance with one or both repeat units adjacent to the repeat unit of formula (II).

Each R⁷ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —(Ar⁷)ᵣ, wherein each Ar⁷ is independently an aryl or heteroaryl group and r is at least 2, preferably a branched or linear chain of phenyl groups each of which may be unsubstituted or substituted with one or more $C_{1-20}$ alkyl groups; and
- a crosslinkable-group, for example a group of formula (XII), (XIII) or (XIV) wherein * is a point of attachment to Ar¹

In the case where R⁷ comprises an aryl or heteroaryl group, or a linear or branched chain of aryl or heteroaryl groups, the or each aryl or heteroaryl group may be substituted with one or more substituents R⁸ selected from the group consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F;
- $NR^9_2$, $OR^9$, $SR^9$, $SiR^9_3$ and
- fluorine, nitro and cyano;

wherein each R⁹ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —NR¹⁷— wherein R¹⁷ is a substituent and is optionally in each occurrence a $C_{1-40}$ hydrocarbyl group, optionally a $C_{1-20}$ alkyl group.

Preferably, each R⁷, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

One preferred class of arylene repeat units is phenylene repeat units, such as phenylene repeat units of formula (VI):

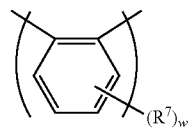
(VI)

wherein w in each occurrence is independently 0, 1, 2, 3 or 4, optionally 1 or 2; n is 1, 2 or 3; and R⁷ independently in each occurrence is a substituent as described above.

If n is 1 then exemplary repeat units of formula (VI) include the following:

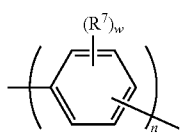

A particularly preferred repeat unit of formula (VI) has formula (VIa):

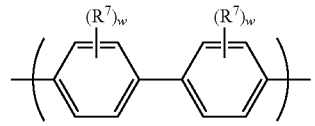
(VIa)

Substituents R⁷ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

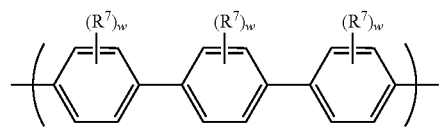

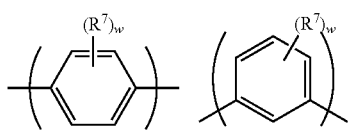

A preferred repeat unit has formula (VIb):

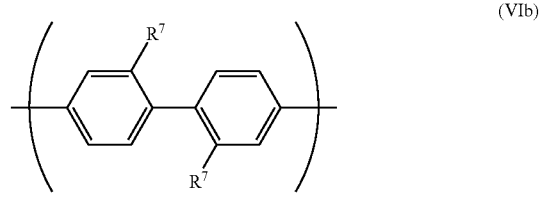
(VIb)

The two R⁷ groups of formula (VIb) may cause steric hindrance between the phenyl rings they are bound to, resulting in twisting of the two phenyl rings relative to one another.

A further class of arylene repeat units is optionally substituted fluorene repeat units, such as repeat units of formula (VII):

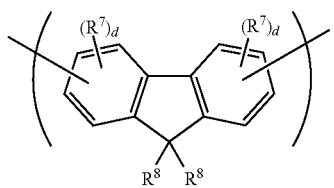

(VII)

wherein $R^8$ in each occurrence is the same or different and is a substituent wherein the two groups $R^8$ may be linked to form a ring; $R^7$ is a substituent as described above; and d is 0, 1, 2 or 3.

Each $R^8$ may independently be selected from the group consisting of:

- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^7)_r$, wherein each $Ar^7$ is independently an aryl or heteroaryl group and r is at least 2, optionally 2 or 3, preferably a branched or linear chain of phenyl groups each of which may be unsubstituted or substituted with one or more $C_{1-20}$ alkyl groups; and
- a crosslinkable-group, for example a group of formula (XII), (XIII) or (XIV).

Preferably, each $R^8$ is independently a $C_{1-40}$ hydrocarbyl group.

Substituted N, where present, may be —$NR^{17}$— wherein $R^{17}$ is as described above.

The aromatic carbon atoms of the fluorene repeat unit may be unsubstituted, or may be substituted with one or more substituents $R^7$ as described with reference to Formula (VI).

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be a 2,7-linked repeat unit of formula (VIIa):

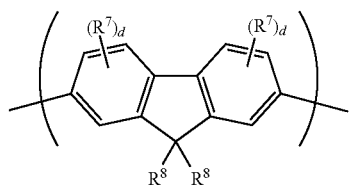

(VIIa)

A relatively high degree of conjugation across the repeat unit of formula (VIIa) may be provided in the case where each d=0, or where any substituent R7 is not present at a position adjacent to the linking 2- or 7-positions of formula (VIIa).

A relatively low degree of conjugation across the repeat unit of formula (VIIa) may be provided in the case where at least one d is at least 1, and where at least one substituent $R^7$ is present at a position adjacent to the linking 2- or 7-positions of formula (VIIa). Optionally, each d is 1 and the 3- and/or 6-position of the repeat unit of formula (VIIa) is substituted with a substituent $R^7$ to provide a relatively low degree of conjugation across the repeat unit.

The repeat unit of formula (VII) may be a 3,6-linked repeat unit of formula (VIIb)

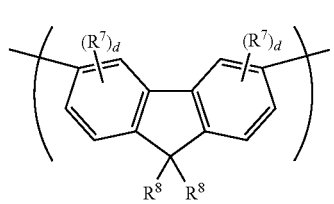

(VIIb)

The extent of conjugation across a repeat unit of formula (VIIb) may be relatively low as compared to a corresponding repeat unit of formula (VIIa).

Another exemplary arylene repeat unit has formula (VIII):

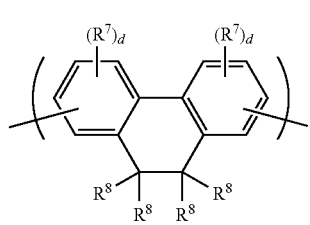

(VIII)

wherein $R^7$, $R^8$ and d are as described with reference to formula (VI) and (VII) above. Any of the $R^7$ groups may be linked to any other of the $R^7$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

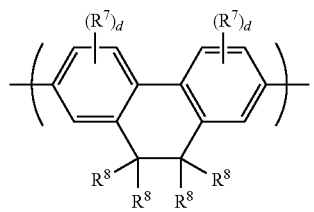
(VIIIa)

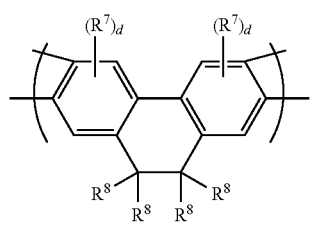
(VIIIb)

The one or more co-repeat units may include a conjugation-breaking repeat unit, which is a repeat unit that does not provide any conjugation path between repeat units adjacent to the conjugation-breaking repeat unit.

Exemplary conjugation-breaking co-repeat units include co-repeat units of formula (XVI):

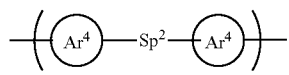
(XVI)

wherein:

$Ar^4$ in each occurrence independently represents an aryl or heteroaryl group that may be unsubstituted or substituted with one or more substituents; and $Sp^2$ represents a spacer group comprising at least one carbon or silicon atom.

Preferably, the spacer group $Sp^2$ includes at least one $sp^3$-hybridised carbon atom separating the $Ar^4$ groups.

Preferably $Ar^4$ is an aryl group and the $Ar^4$ groups may be the same or different. More preferably each $Ar^4$ is phenyl.

Each $Ar^4$ may independently be unsubstituted or may be substituted with 1, 2, 3 or 4 substituents. The one or more substituents may be selected from:

$C_{1-20}$ alkyl wherein one or more non-adjacent C atoms of the alkyl group may be replaced by O, S or COO, C=O, $NR^{17}$ or $SiR^{17}_2$ and one or more H atoms of the $C_{1-20}$ alkyl group may be replaced by F wherein $R^{17}$ is a substituent and is optionally in each occurrence a $C_{1-40}$ hydrocarbyl group, optionally a $C_{1-20}$ alkyl group; and aryl or heteroaryl, optionally phenyl, that may be unsubstituted or substituted with one or more $C_{1-20}$ alkyl groups.

Preferred substituents of $Ar^4$ are $C_{1-20}$ alkyl groups, which may be the same or different in each occurrence.

Exemplary groups $Sp^2$ include a $C_{1-20}$ alkyl chain wherein one or more non-adjacent C atoms of the chain may be replaced with O, S, $-NR^{17}-$, $-SiR^{17}_2-$, $-C(=O)-$ or $-COO-$ and wherein $R^{17}$ in each occurrence is a substituent and is optionally in each occurrence a $C_{1-40}$ hydrocarbyl group, optionally a $C_{1-20}$ alkyl group.

Exemplary repeat units of formula (XVI) include the following, wherein R in each occurrence is H or $C_{1-5}$ alkyl:

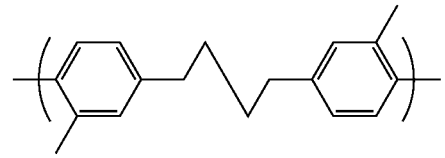

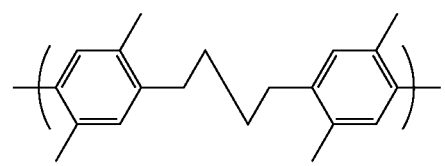

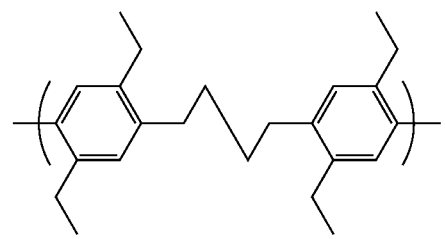

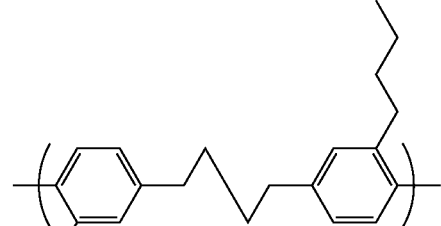

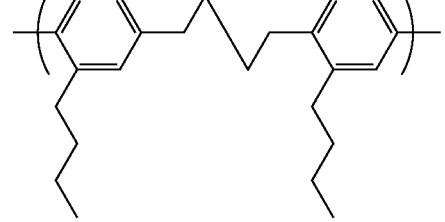

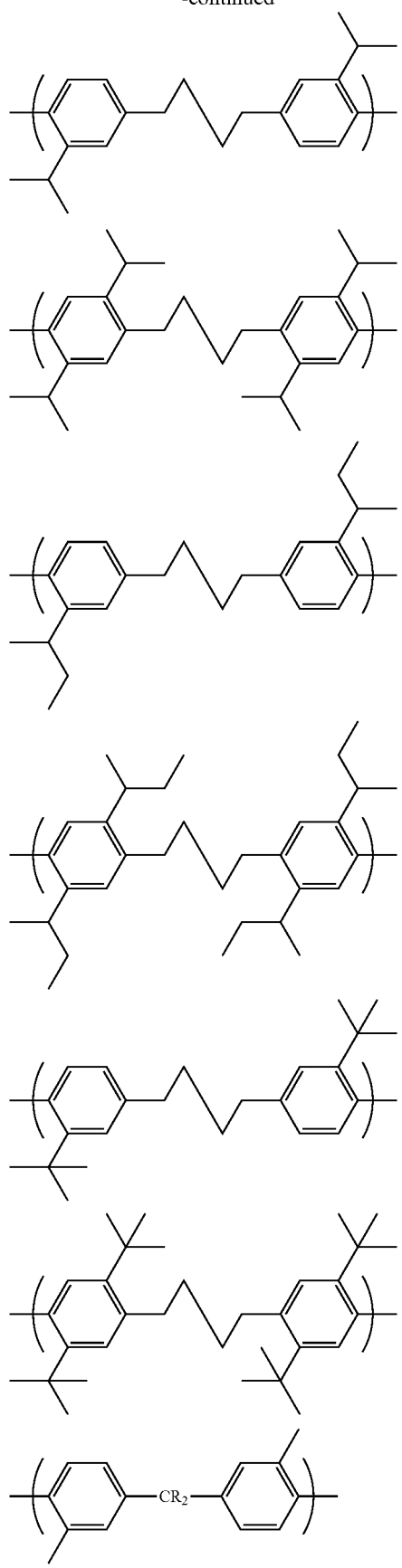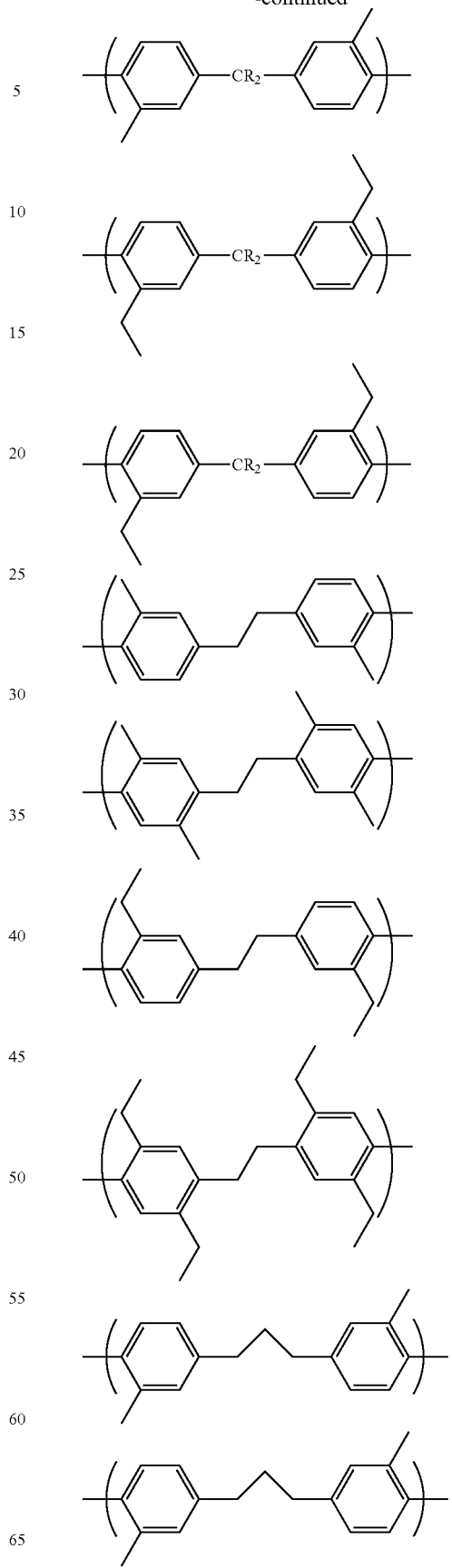

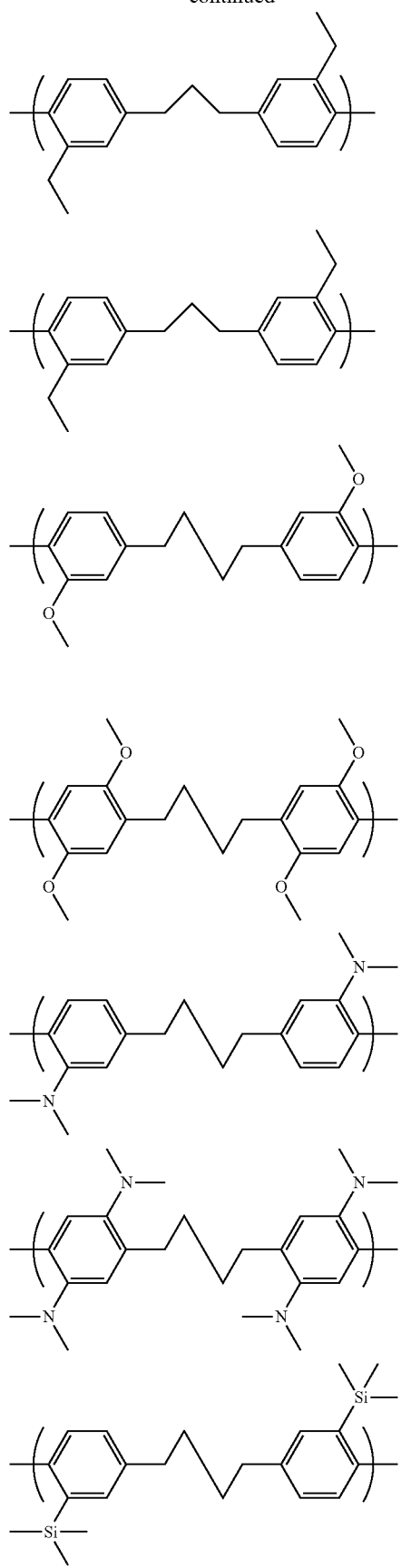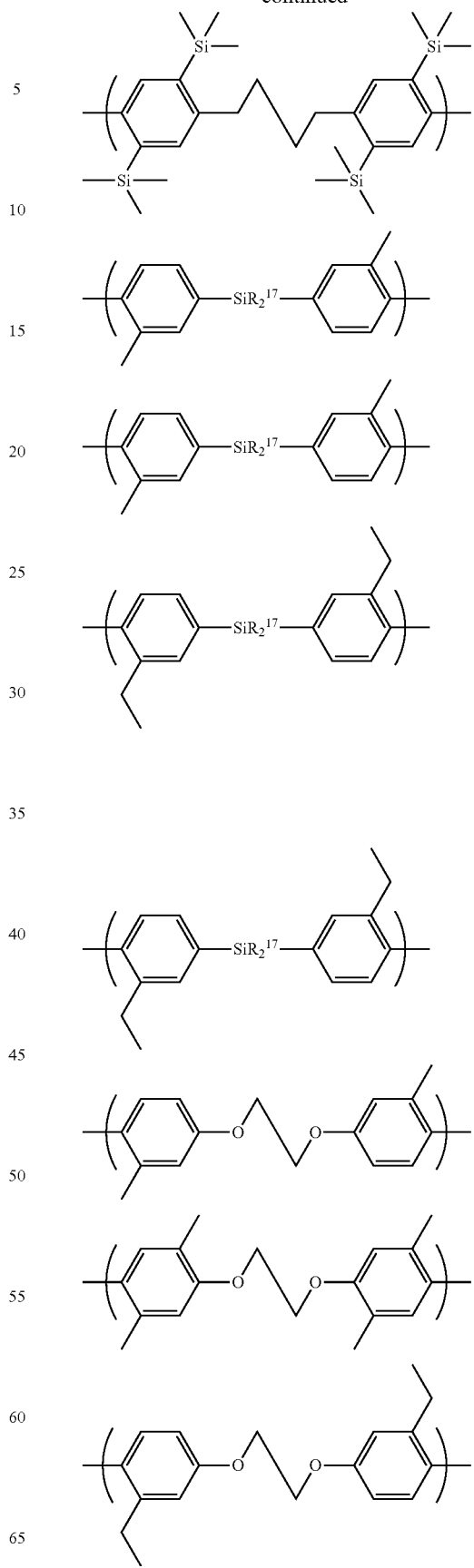

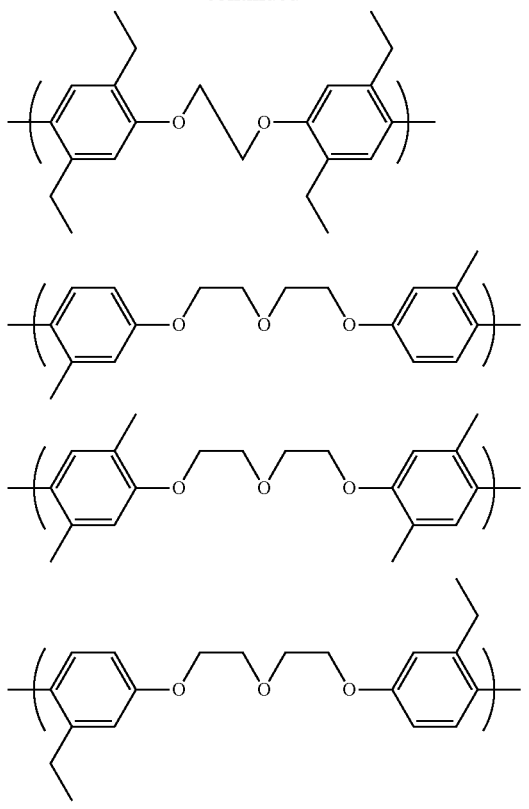

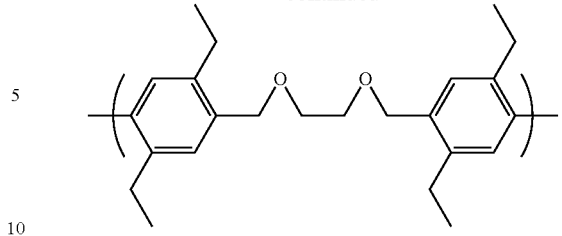

The hole-transporting polymer may contain crosslinkable groups that may be crosslinked following deposition of the hole-transporting polymer to form an insoluble, crosslinked hole-transporting layer prior to formation of the first light-emitting layer.

Crosslinkable groups may be provided as part of any repeat units of the polymer, for example part of a repeat unit of formula (III) and/or a co-repeat unit, such as a repeat of formula (II), (VI), (VII), (VIII) or (XVI) that may be present in the hole-transporting polymer.

Exemplary methods for forming conjugated hole-transporting polymers as described herein are by Suzuki polymerisation in the presence of a palladium catalyst and a base, and Yamamoto polymerisation in the presence of a nickel catalyst to form C—C bonds between two aromatic or heteroaromatic groups, and so form polymers having conjugation extending across two or more repeat units.

Yamamoto polymerisation may take place by polymerisation of monomers having two or more bromine or iodine substituents on an aryl or heteroaryl group of a monomer.

Suzuki polymerisation is described in WO 00/53656 or U.S. Pat. No. 5,777,070 Suzuki polymerisation. As illustrated in Scheme 1, in the Suzuki polymerisation process a monomer for forming repeat units RU1 having leaving groups LG1 such as boronic acid or boronic ester groups undergoes polymerisation with a monomer for forming repeat units RU2 having leaving groups LG2 such as halogen, sulfonic acid or sulfonic ester to form a carbon-carbon bond between RU1 and RU2:

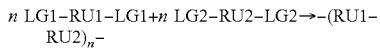

Scheme 1

Preferably, one of LG1 and LG2 is bromine or iodine and the other is a boronic acid or boronic ester. One method of forming a polymer comprising more than 50 mol % hole-transporting repeat units is to polymerise monomers containing hole-transporting units having two or more leaving groups LG1 and monomers containing hole-transporting units having two or more leaving groups LG2, the total number of monomers containing hole-transporting units forming more than 50 mol % of all monomers.

It will be appreciated that Suzuki polymerisation may be used to form a homopolymer, or polymers containing two or more different repeat units.

A polymer containing more than 50 mol % of a hole-transporting repeat unit may be formed by Suzuki polymerisation of more than 25 mol % of a hole-transporting monomer having leaving groups LG1 and more than 25 mol % of a monomer having leaving groups LG2.

Polymers as described herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the polymers described herein may be $1\times10^3$ to $1\times10^8$, and preferably $1\times10^4$ to $1\times10^7$.

The hole-transporting polymers as described anywhere herein are suitably amorphous polymers.

Further Light-Emitting Compounds

The first light-emitting layer contains a compound of formula (I). Further light-emitting materials, if present in the first light-emitting layer or in another layer of the device, may each independently be selected from fluorescent or phosphorescent materials.

Phosphorescent light-emitting materials are preferably phosphorescent transition metal complexes.

Further phosphorescent light-emitting materials may be green or red-emitting phosphorescent transition metal complexes of (IX):

$$ML^1_q L^2_r L^3_s \qquad (IX)$$

wherein M is a metal; each of $L^1$, $L^2$ and $L^3$ is a coordinating group; q is a positive integer; r and s are each independently 0 or a positive integer; and the sum of (a·q)+(b·r)+(c·s) is equal to the number of coordination sites available on M, wherein a is the number of coordination sites on $L^1$, b is the number of coordination sites on $L^2$ and c is the number of coordination sites on $L^3$. Preferably, a, b and c are each 1 or 2, more preferably 2 (bidentate ligand). In preferred embodiments, q is 2, r is 0 or 1 and s is 0, or q is 3 and r and s are each 0.

Suitable metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (X):

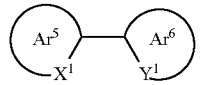

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ may be selected from phenyl, fluorene, naphthyl and $Ar^6$ are selected from quinoline, isoquinoline, thiophene and benzothiophene.

To achieve green emission, $Ar^5$ may be selected from phenyl or fluorene and $Ar^6$ may be pyridine.

Exemplary ligands of formula (X) include the following:

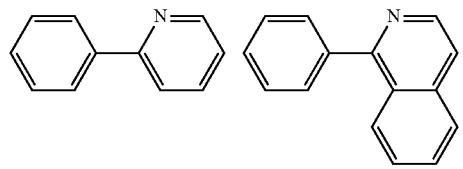

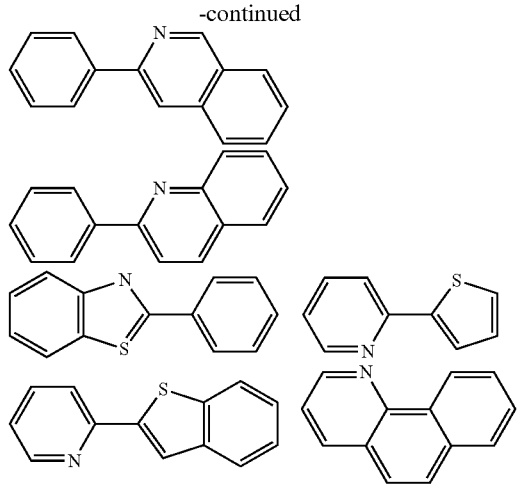

Other ligands suitable for use with d-block elements include diketonates, in particular acetylacetonate (acac), tetrakis-(pyrazol-1-yl)borate, 2-carboxypyridyl, triarylphosphines and pyridine, each of which may be substituted.

Each of $Ar^5$ and $Ar^6$ may carry one or more substituents. Two or more of these substituents may be linked to form a ring, for example an aromatic ring.

Exemplary substituents include groups $R^7$ as described above with reference to Formula (II). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; charge transporting groups, for example carbazole which may be used to assist hole transport to the complex when used as an emissive material, for example as disclosed in WO 02/81448; and dendrons which may be used to obtain or enhance solution processability of the metal complex, for example as disclosed in WO 02/66552. If substituents $R^7$ include a charge-transporting group then the compound of formula (IX) may be used in light-emitting layer 107 without a separate host material.

A light-emitting dendrimer comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

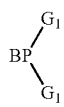

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

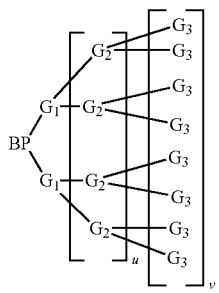
(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl.

In another preferred embodiment, BP is an electron-deficient heteroaryl, for example pyridine, 1,3-diazine, 1,4-diazine, 1,2,4-triazine or 1,3,5-triazine and $G_2$ ... $G_n$ is an aryl group, optionally phenyl.

Preferred dendrons are a substituted or unsubstituted dendron of formulae (XIb) and (XIc):

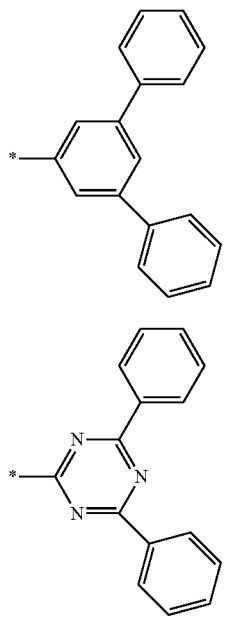
(XIb)

(XIc)

wherein * represents an attachment point of the dendron to a core.

BP and/or any group G may be substituted with one or more substituents, for example one or more $C_{1-20}$ alkyl or alkoxy groups.

First Light-Emitting Layer

The first light-emitting layer 107 preferably contains the compound of formula (I) and a host material. The host material may be a non-polymeric or polymeric material. The host material preferably has a lowest excited state triplet energy level that is the same as or higher than the triplet energy level of the compound of formula (I).

Exemplary non-polymeric hosts have formula (XV):

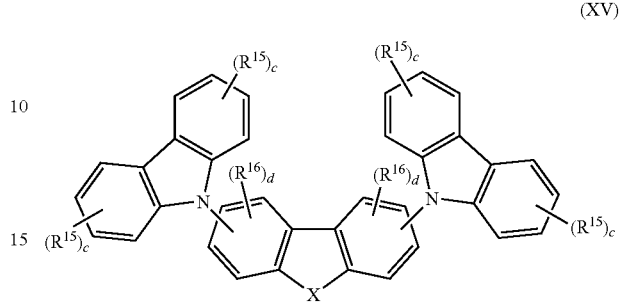
(XV)

wherein each $R^{15}$ and $R^{16}$ is independently a substituent; X is O or S; each c is independently 0, 1, 2, 3 or 4; and each d is independently 0, 1, 2 or 3.

The host of formula (XV) may have formula (XVa):

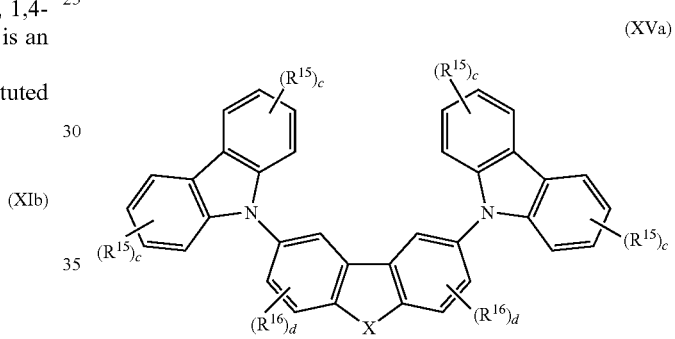
(XVa)

Each $R^{15}$ and $R^{16}$, where present, may independently in each occurrence be selected from the group consisting of alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F; aryl and heteroaryl groups that may be unsubstituted or substituted with one or more substituents; and a branched or linear chain of aryl or heteroaryl groups. Exemplary aryl or heteroaryl groups are unsubstituted phenyl and phenyl substituted with one or more $C_{1-20}$ alkyl groups; F; CN and $NO_2$.

X is preferably S.

Host polymers include polymers having a non-conjugated backbone with charge-transporting groups pendant from the polymer backbone, and polymers having a conjugated backbone in which adjacent repeat units of the polymer backbone are conjugated together. A conjugated host polymer may comprise, without limitation, repeat units selected from optionally substituted arylene or heteroarylene repeat units including any of the arylene units (VI), (VII) and (VIII) described above; conjugation-breaking repeat units of formula (XVI) as described above; and/or arylamine repeat units.

The host polymer may contain triazine-containing repeat units. Exemplary triazine-containing repeat units have formula (IV):

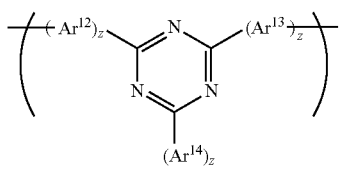

(IV)

wherein $Ar^{12}$, $Ar^{13}$ and $Ar^{14}$ are independently selected from substituted or unsubstituted aryl or heteroaryl, and z in each occurrence is independently at least 1, optionally 1, 2 or 3, preferably 1.

Any of $Ar^{12}$, $Ar^{13}$ and $Ar^{14}$ may be substituted with one or more substituents. Exemplary substituents are substituents $R^{10}$, wherein each $R^{10}$ may independently be selected from the group consisting of:
- substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and
- a crosslinkable group attached directly to $Ar^{12}$, $Ar^{13}$ and $Ar^{14}$ or spaced apart therefrom by a spacer group, for example a group comprising a double bond such and a vinyl or acrylate group, or a benzocyclobutane group.

Substituted N, where present, may be —$NR^{17}$— wherein $R^{17}$ is a substituent as described above.

Preferably, $Ar^{12}$, $Ar^{13}$ and $Ar^m$ of formula (IV) are each phenyl, each phenyl independently being unsubstituted or substituted with one or more $C_{1-20}$ alkyl groups.

$Ar^{14}$ of formula (IV) is preferably phenyl, and is optionally substituted with one or more $C_{1-20}$ alkyl groups or a crosslinkable unit.

A particularly preferred repeat unit of formula (IV) has formula (IVa).

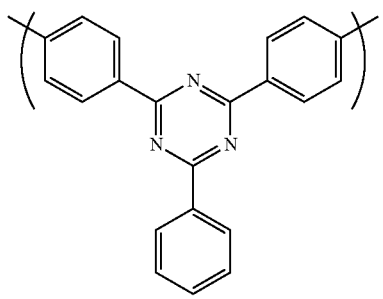

(IVa)

The repeat unit of formula (IVa) be unsubstituted or substituted with one or more substituents $R^{10}$ as described above with respect to formula (IV), preferably one or more $C_{1-20}$ alkyl groups.

The compound of formula (I), and/or any other phosphorescent material of the first light-emitting layer, may be covalently bound to a host polymer. A phosphorescent material of the hole-transporting layer may be covalently bound to the hole-transporting polymer. A phosphorescent material may be covalently bound to a host polymer as a repeat unit in the polymer backbone, as an end-group of the polymer, or as a side-chain of the polymer. If the phosphorescent material is provided as a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO. A phosphorescent material in a hole-transporting layer or in the light-emitting layer 107, and optional spacer, may be provided as a substituent of any of repeat units of formulae (I), (II), (III), (IV), (VI), (VII) or (VIII) described above that may be present in the hole-transporting polymer or host polymer.

Covalent binding of a phosphorescent material to a hole-transporting polymer may reduce or avoid washing of the phosphorescent material out of the hole-transporting layer if an overlying layer is deposited from a formulation of the overlying layer's materials in a solvent or solvent mixture.

The compound of formula (I) mixed with a host material or hole-transporting polymer may form 0.1-50 weight %, optionally 0.1-30 wt % of the weight of the components of the layer containing the phosphorescent material.

If the compound of formula (I) is covalently bound to a host polymer then repeat units comprising the phosphorescent material, or an end unit comprising the phosphorescent material, may form 0.1-20 mol of the polymer.

If two or more phosphorescent materials are provided in the first light emitting layer then the phosphorescent material with the highest triplet energy level is preferably provided in a larger weight percentage than the lower triplet energy level material or materials.

HOMO and LUMO Level Measurement

HOMO and LUMO levels as described anywhere herein may be measured by square wave voltammetry.

The working electrode potential may be ramped linearly versus time. When square wave voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and Settings:

3 mm diameter glassy carbon working electrode
Ag/AgCl/no leak reference electrode
Pt wire auxiliary electrode
0.1 M tetrabutylammonium hexafluorophosphate in acetonitrile
LUMO=4.8—ferrocene (peak to peak maximum average)+onset
Sample: 1 drop of 5 mg/mL in toluene spun at 3000 rpm LUMO (reduction) measurement: A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

Electron-Transporting Layers

The light-emitting layer 107 may be adjacent to the anode. In other embodiments, an electron-transporting layer may be provided between the light-emitting layer 107 and the cathode 109.

If present, an electron transporting layer located between the light-emitting layer and cathode preferably has a LUMO level of around 1.8-2.7 eV as measured by square wave voltammetry. An electron-transporting layer may have a thickness in the range of about 5-100 nm, optionally 5-50 nm, optionally 5-20 nm.

Electron-transporting materials for forming an electron-transporting layer may be non-polymeric or polymeric compounds and may be deposited from a solution in a solvent or solvent mixture that the components of the first light-emitting layer are substantially insoluble in. The electron transporting materials may be substituted with polar groups and may be soluble in polar solvents.

Exemplary electron transporting polymers suitable for forming an electron-transporting layer are described in WO 2012/133229, the contents of which are incorporated herein by reference.

Hole Injection Layers

A hole injection layer may be provided between the anode 103 and the hole-transporting layer 105. A first surface of the hole-injection layer is preferably in contact with the anode. A second, opposing surface of the hole-injection layer may be in contact with the hole-transporting layer 105, or may be spaced apart therefrom, for example spaced apart therefrom by a hole-transporting layer. The hole-injection layer may be formed from a conductive organic or inorganic material, and may be formed from a degenerate semiconductor.

Examples of conductive organic materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode 109 is selected from materials that have a workfunction allowing injection of electrons into the first light-emitting layer 107 of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin, preferably 0.5-5 nm, layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming the hole-transporting layer and the first light-emitting layer may be formed from the components forming those layers and one or more suitable solvents.

The formulation may be a solution of the components of the layer in question, or may be a dispersion in the one or more solvents in which one or more components are not dissolved. Preferably, the formulation is a solution.

Exemplary solvents include benzenes substituted with one or more substituents selected from $C_{1-10}$ alkyl and $C_{1-10}$ alkoxy groups, for example toluene, xylenes and methylanisoles, and mixtures thereof.

Particularly preferred solution deposition techniques including printing and coating techniques such spin-coating and inkjet printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

Preferably the hole-transporting polymer carries crosslinkable groups that are reacted following deposition of the hole-transporting polymer to form a crosslinked hole-transporting layer. The polymer may be crosslinked by thermal treatment or by irradiation, for example UV irradiation. Thermal crosslinking may be at a temperature in the range of about 80-250° C., optionally about 80-200° C. or about 120-200° C.

Examples

General Device Process

Organic light-emitting devices having the following structure were prepared:
ITO/HIL/HTL/LE/ETL/Cathode
wherein ITO is an indium-tin oxide anode; HIL is a hole-injecting layer, HTL is a light-emitting, hole-transporting layer and LE is a light-emitting layer.

A substrate carrying ITO was cleaned using UV/Ozone. The hole injection layer was formed by spin-coating an aqueous formulation of a hole-injection material available from Plextronics, Inc. A hole transporting layer was formed to a thickness of about 20 nm by spin-coating a hole-transporting polymer containing a red phosphorescent repeat unit and crosslinking the polymer by heating. A light-emitting layer was formed to a thickness of about 65 nm by spin-coating a light-emitting composition of Host Material 1 (75 wt %), Green Phosphorescent Emitter 1 (1 wt %) and Blue Phosphorescent Emitter 1 (24 wt %). Green Phosphorescent Emitter 1 is tris[2-phenylpyridinato-C,N]iridium (III) wherein each ligand is substituted with a dendron as described in WO 02/066552.

An electron-transporting layer was formed to a thickness of about 10 nm by spin-coating an electron-transporting polymer comprising the cesium salt of electron-transporting repeat unit 1 as described in WO 2012/133229.

A cathode was formed by evaporation of a first layer of sodium fluoride to a thickness of about 2 nm, a second layer of aluminium to a thickness of about 100 nm and a third layer of silver to a thickness of about 100 nm.

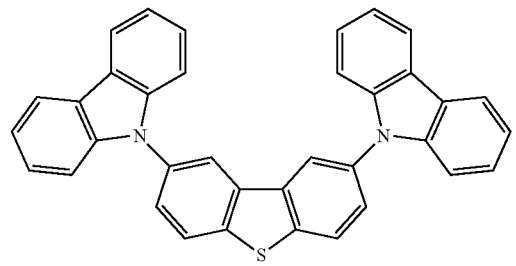

Host 1

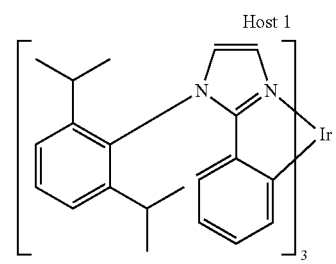

Blue Phosphorescent Emitter 1

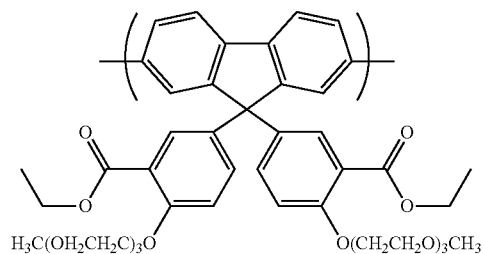

Electron-transporting repeat unit 1

Blue Phosphorescent Emitter 1 has a HOMO level of about 4.8 eV.

Device Example 1

A device was prepared according to the General Device Process wherein the light-emitting hole-transporting polymer was Hole Transporting Polymer 1 formed by polymerising a polymerisation mixture containing 50 mol % benzene-1,4-di-boronic acid pinacol ester monomers substituted with crosslinkable groups to form repeat units of formula (VIa); 3 mol % of Red Phosphorescent Monomer 1; and 47 mol % of Amine Monomer 1 by Suzuki polymerisation as described in WO 00/53656.

Hole-Transporting Polymer 1 has a HOMO level of 4.96 eV.

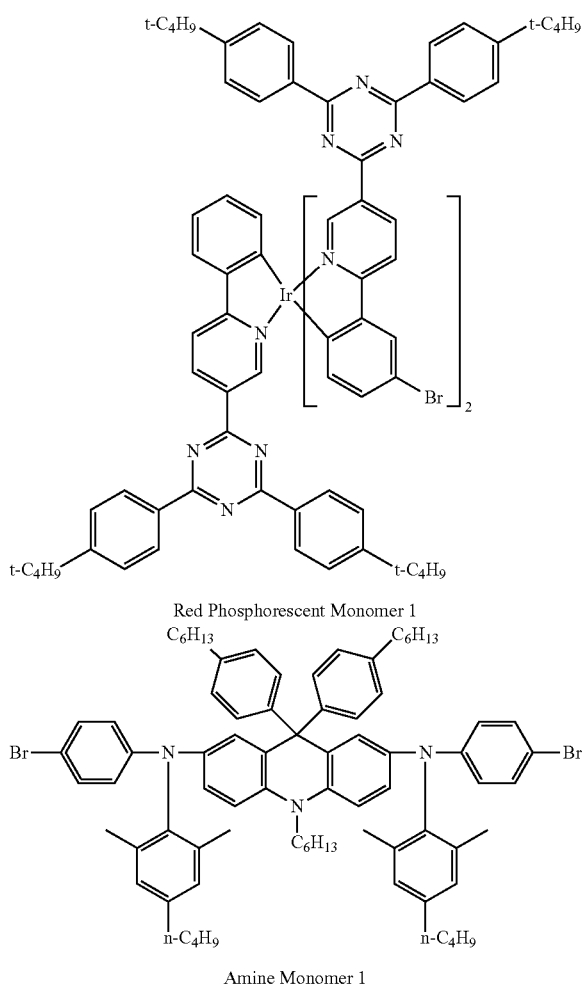

Red Phosphorescent Monomer 1

Amine Monomer 1

Comparative Device 1

A device was prepared as described for Device Example 1 except that Comparative Hole Transporting Polymer 1 was used in place of Hole Transporting Polymer 1.

Comparative Hole Transporting Polymer 1 was formed as described for Hole Transporting Polymer 1 except that Amine Monomer 1 was replaced with an amine monomer for forming a 2,7-bis(N,N-diphenylamino)fluorene repeat unit as described in US 2007/0126345.

Comparative Hole Transporting Polymer 1 has a HOMO level of 5.16 eV.

With reference to Table 1, Device Example 1 requires a lower drive voltage than Comparative Device 1 at a current density of 10 mA/cm$^2$ and at a brightness of 1000 cd/m$^2$; a higher external quantum efficiency at a brightness of 1000 cd/m$^2$; and a higher efficiency at a brightness of 1000 cd/m$^2$

| Device | Voltage at 10 mA/cm$^2$ (V) | Voltage at 1000 cd/m$^2$ (V) | EQE @ 1000 cd/m$^2$ (%) | Efficiency at 1000 cd/m$^2$ (Lm/W) |
|---|---|---|---|---|
| Comparative Device 1 | 5.6 | 4.7 | 14.6 | 23.5 |
| Device Example 1 | 4.5 | 3.6 | 17.1 | 37.6 |

Figure 2:
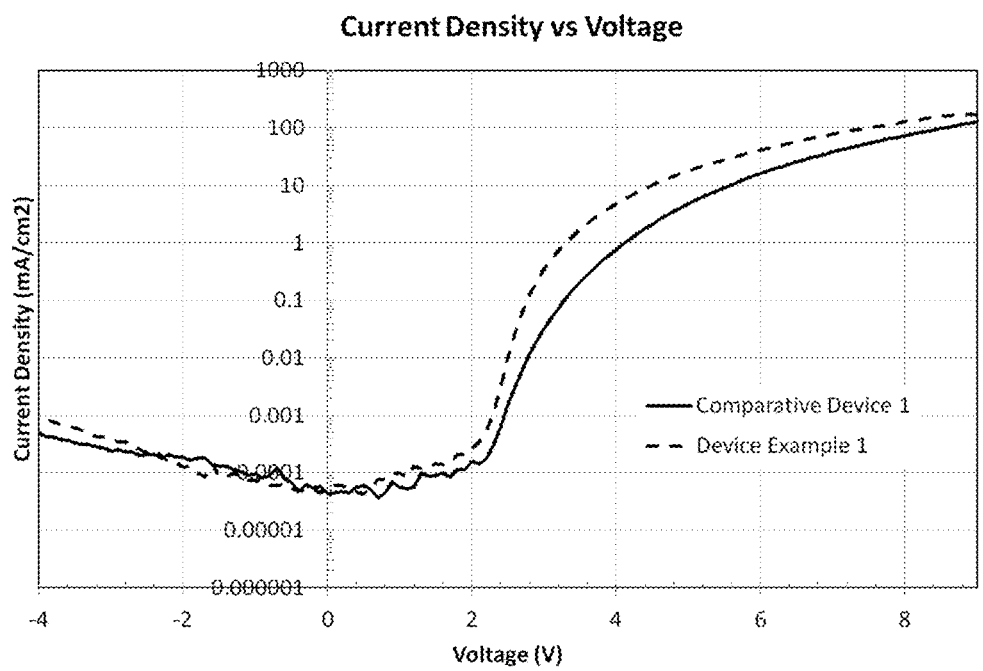
FIG. 2 is a graph of current density vs. voltage for a device according to an embodiment of the invention and a comparative device.

FIG. 2 shows that Device Example 1 has a higher current density than Comparative Device 1 across a range of voltages.

Figure 3:
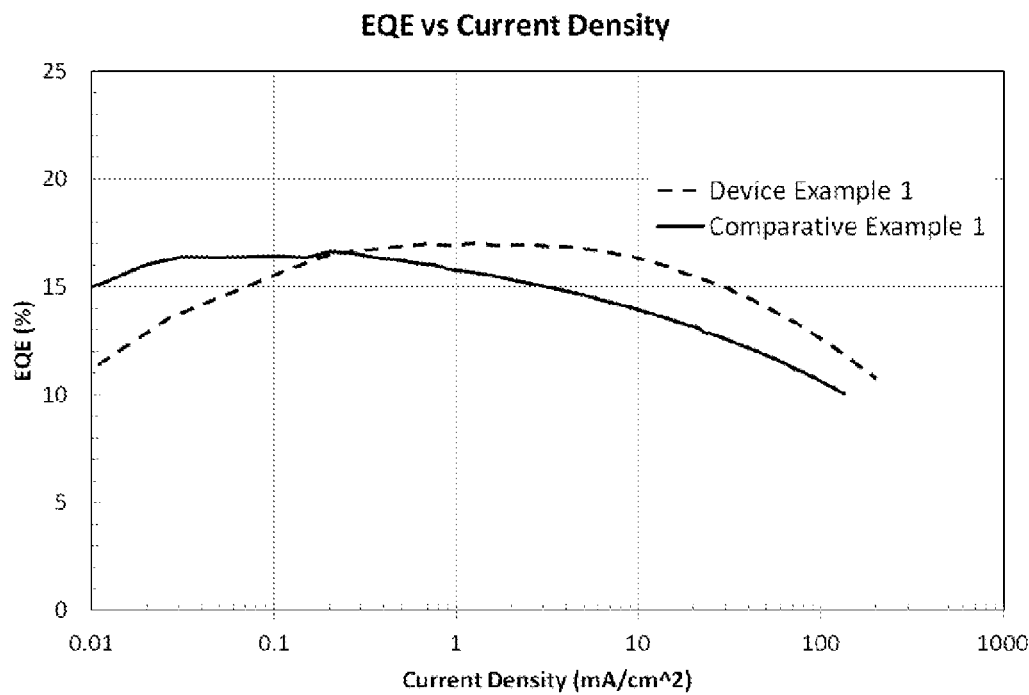
FIG. 3 is a graph of external quantum efficiency vs. current density for a device according to an embodiment of the invention and a comparative device.

FIG. 3 shows that Device Example 1 has a higher EQE than Comparative Device 1 except at particularly low current densities.

Figure 4:
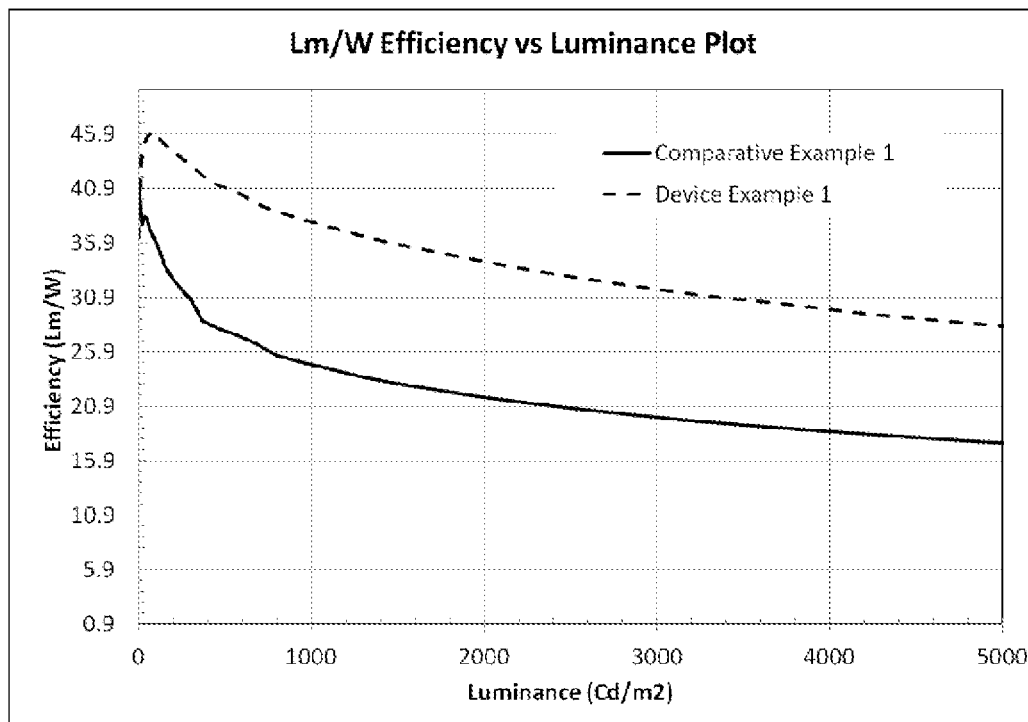
FIG. 4 is a graph of efficiency in lumens per Watt vs. luminance for a device according to an embodiment of the invention and a comparative device.

FIG. 4 shows that Device Example 1 has a higher efficiency than Comparative Device 1 across a range of brightnesses.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. An organic light-emitting device comprising an anode; a cathode; a light-emitting layer between the anode and the cathode; and a hole-transporting layer between the anode and the light-emitting layer and adjacent to the light-emitting layer, wherein the light-emitting layer comprises a light-emitting compound of formula (I) and the hole-transporting layer comprises a hole-transporting material having a HOMO level that is no more than 5.1 eV from vacuum level as measured by square wave voltammetry, and the HOMO level of the compound of formula (I) is closer to vacuum level than the HOMO level of the hole-transporting material as measured by square wave voltammetry:

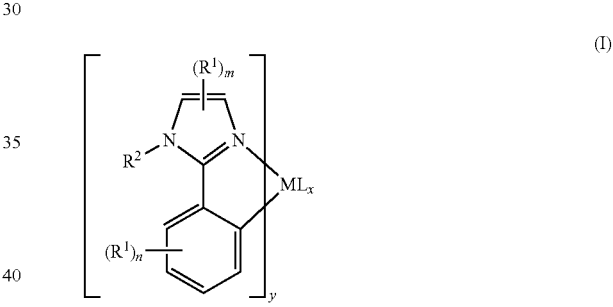

wherein:
$R^1$ in each occurrence is independently a substituent;
$R^2$ is H or a substituent;
m is 0, 1 or 2;
n is 0, 1, 2, 3 or 4;
M is a transition metal;
L is a ligand;
y is at least 1; and
x is 0 or a positive integer;
and wherein the hole-transporting material is a non-polymeric compound of formula (III) or a polymer comprising a repeat unit of formula (III-2):

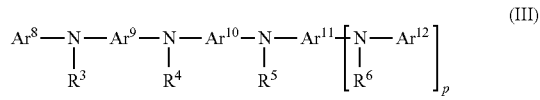

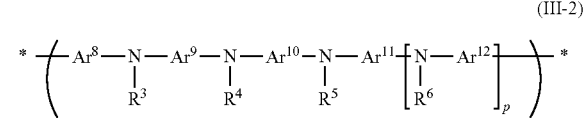

wherein:
Ar$^8$, Ar$^9$, Ar$^{10}$, Ar$^{11}$ and Ar$^{12}$ in each occurrence are independently fluorene or phenyl, each of which is independently unsubstituted or substituted with one or more substituents selected from C$_{1-20}$ alkyl, wherein one or more non-adjacent C atoms may be replaced with optionally substituted aryl or heteroaryl, O, S, C=O or —COO— and one or more H atoms may be replaced with F; and a crosslinkable group;

R$^3$, R$^4$, R$^5$ and R$^6$ are each independently:

an aryl or heteroaryl group Ar$^{13}$ or a branched or linear chain of Ar$^{13}$ groups, wherein each Ar$^{13}$ independently is unsubstituted or substituted with one or more substituents R$^{18}$ selected from C$_{1-20}$ alkyl wherein one or more non-adjacent C atoms may be replaced with optionally substituted aryl or heteroaryl, O, S, C=O, or —COO—, and one or more H atoms may be replaced with F;

a C$_{1-20}$ alkyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F;

a C$_{1-20}$ alkyl-phenyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F; or a crosslinkable unit that is bound directly to the N atom of formula (III) or (III-2) or spaced apart therefrom by a spacer group;

wherein Ar$^9$ and Ar$^{10}$ are linked by a group of formula CR$^{19}_2$ wherein each occurrence of R$^{19}$ in the group linking Ar$^9$ and Ar$^{10}$ is independently a substituent; and p is 0 or a positive integer.

2. An organic light-emitting device according to claim 1 wherein the hole-transporting material has a HOMO level that is no more than 5.0 eV from vacuum level as measured by square wave voltammetry.

3. An organic light-emitting device according to claim 1 wherein the light-emitting compound of formula (I) has a photoluminescent spectrum with a peak of up to about 490 nm.

4. An organic light-emitting device according to claim 1 wherein the hole-transporting layer comprises a light-emitting material.

5. An organic light-emitting device according to claim 4 wherein the light-emitting material of the hole-transporting layer has a photoluminescence spectrum with a peak in the range of about more than 550 up to about 700 nm.

6. An organic light-emitting device according to claim 1 wherein the device is a white light-emitting device.

7. An organic light-emitting device according to claim 1 wherein y is 3 and x is 0.

8. An organic light-emitting device according to claim 1 wherein R$^2$ is a C$_{1-30}$ hydrocarbyl group.

9. An organic light-emitting device according to claim 1 wherein n is 0.

10. An organic light-emitting device according to claim 1 wherein m is 0.

11. An organic light-emitting device according to claim 1 wherein the HOMO level of the compound of formula (I) is no more than 0.1 eV closer to vacuum level than the HOMO level of the hole-transporting material as measured by square wave voltammetry.

12. An organic light-emitting device according to claim 1, wherein the hole-transporting material is the polymer comprising a repeat unit of formula (III-2).

13. An organic light-emitting device according to claim 1, wherein R$^3$, R$^4$, R$^5$, and R$^6$ are each independently an aryl or heteroaryl group Ar$^{13}$ which is unsubstituted or substituted with one or more substituents R$^{18}$.

14. An organic light-emitting device according to claim 1 wherein the hole-transporting layer is adjacent to and in contact with the light-emitting layer.

15. A method of forming an organic light-emitting device according to claim 1 comprising the steps of forming the hole-transporting layer over the anode; forming the light-emitting layer over the hole-transporting layer; and forming the cathode over the first light-emitting layer.

16. A method according to claim 15 wherein the first light-emitting layer is formed by depositing a formulation comprising the compound of formula (I) over the hole-transporting layer, and evaporating the one or more solvents.

17. A method according to claim 16 wherein the hole-transporting layer is crosslinked prior to formation of the light-emitting layer.

18. An organic light-emitting device comprising an anode; a cathode; a light-emitting layer between the anode and the cathode; and a hole-transporting layer between the anode and the light-emitting layer and adjacent to the light-emitting layer, wherein the light-emitting layer comprises a light-emitting compound of formula (I) and the hole-transporting layer comprises a hole-transporting material having a HOMO level that is no more than 5.0 eV from vacuum level as measured by square wave voltammetry:

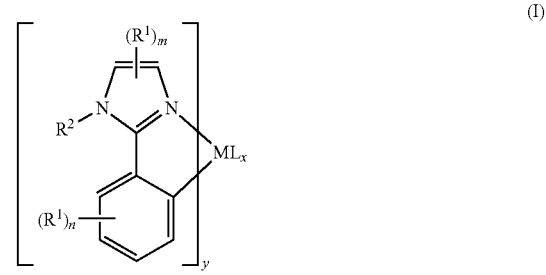

(I)

wherein:
R$^1$ in each occurrence is independently a substituent;
R$^2$ is H or a substituent;
m is 0, 1 or 2
n is 0, 1, 2, 3 or 4;
M is a transition metal;
L is a ligand;
y is at least 1; and
x is 0 or a positive integer;
and wherein the hole-transporting material is a non-polymeric compound of formula (III) or
a polymer comprising a repeat unit of formula (III-2):

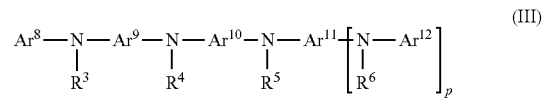

(III)

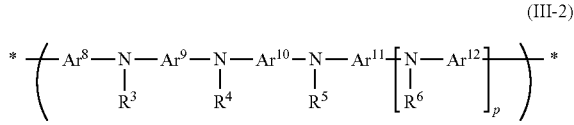

(III-2)

wherein:
Ar$^8$, Ar$^9$, Ar$^{10}$, Ar$^{11}$ and Ar$^{12}$ in each occurrence are independently fluorene or phenyl, each of which is independently unsubstituted or substituted with one or more substituents selected from C$_{1-20}$ alkyl, wherein one or more non-adjacent C atoms may be replaced with optionally substituted aryl or heteroaryl, O, S, C=O or —COO— and one or more H atoms may be replaced with F; and a crosslinkable group;

R$^3$, R$^4$, R$^5$ and R$^6$ are each independently:

an aryl or heteroaryl group Ar$^{13}$ or a branched or linear chain of Ar$^{13}$ groups, wherein each Ar$^{13}$ independently is unsubstituted or substituted with one or more substituents R$^{18}$ selected from C$_{1-20}$ alkyl wherein one or more non-adjacent C atoms may be replaced with optionally substituted aryl or heteroaryl, O, S, C=O, or —COO—, and one or more H atoms may be replaced with F;

a C$_{1-20}$ alkyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F;

a C$_{1-20}$ alkyl-phenyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F; or a crosslinkable unit that is bound directly to the N atom of formula (III) or (III-2) or spaced apart therefrom by a spacer group;

wherein Ar$^9$ and Ar$^{10}$ are linked by a group of formula CR$^{19}_2$ wherein each occurrence of R$^{19}$ in the group linking Ar$^9$ and Ar$^{10}$ is independently a substituent; and p is 0 or a positive integer.

19. An organic light-emitting device comprising an anode; a cathode; a light-emitting layer between the anode and the cathode; and a hole-transporting layer between the anode and the light-emitting layer and adjacent to the light-emitting layer, wherein the light-emitting layer comprises a light-emitting compound of formula (I) and the hole-transporting layer comprises a hole-transporting material having a HOMO level that is no more than 5.1 eV from vacuum level as measured by square wave voltammetry, wherein the HOMO level of the compound of formula (I) is no more than 0.1 eV closer to vacuum level than the HOMO level of the hole-transporting material as measured by square wave voltammetry:

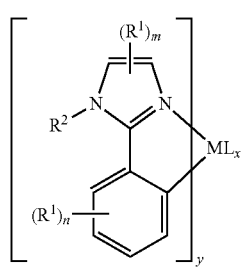

(I)

wherein:
R$^1$ in each occurrence is independently a substituent;
R$^2$ is H or a substituent;

m is 0, 1 or 2
n is 0, 1, 2, 3 or 4;
M is a transition metal;
L is a ligand;
y is at least 1; and
x is 0 or a positive integer;
and wherein the hole-transporting material is a non-polymeric compound of formula (III) or a polymer comprising a repeat unit of formula (III-2):

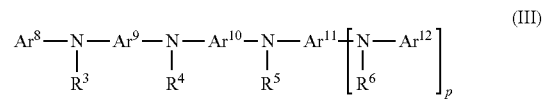

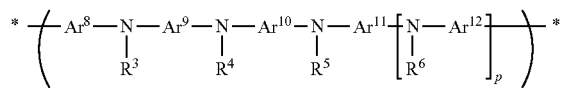

wherein:
Ar$^8$, Ar$^9$, Ar$^{10}$, Ar$^{11}$ and Ar$^{12}$ in each occurrence are independently fluorene or phenyl, each of which is independently unsubstituted or substituted with one or more substituents selected from C$_{1-20}$ alkyl, wherein one or more non-adjacent C atoms may be replaced with optionally substituted aryl or heteroaryl, O, S, C=O or —COO— and one or more H atoms may be replaced with F; and a crosslinkable group;

R$^3$, R$^4$, R$^5$ and R$^6$ are each independently:

an aryl or heteroaryl group Ar$^{13}$ or a branched or linear chain of Ar$^{13}$ groups, wherein each Ar$^{13}$ independently is unsubstituted or substituted with one or more substituents R$^{18}$ selected from C$_{1-20}$ alkyl wherein one or more non-adjacent C atoms may be replaced with optionally substituted aryl or heteroaryl, O, S, C=O, or —COO—, and one or more H atoms may be replaced with F;

a C$_{1-20}$ alkyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F;

a C$_{1-20}$ alkyl-phenyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F; or a crosslinkable unit that is bound directly to the N atom of formula (III) or (III-2) or spaced apart therefrom by a spacer group;

wherein Ar$^9$ and Ar$^{10}$ are linked by a group of formula CR$^{19}_2$ wherein each occurrence of R$^{19}$ in the group linking Ar$^9$ and Ar$^{10}$ is independently a substituent; and p is 0 or a positive integer.

20. An organic light-emitting device comprising an anode; a cathode; a light-emitting layer between the anode and the cathode; and a hole-transporting layer between the anode and the light-emitting layer and adjacent to the light-emitting layer, wherein the light-emitting layer comprises a light-emitting compound of formula (I) and the hole-transporting layer comprises a hole-transporting material having a HOMO level that is no more than 5.1 eV from vacuum level as measured by square wave voltammetry:

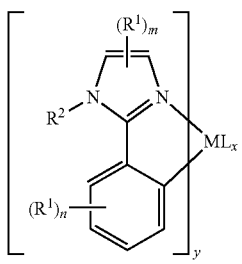

(I)

wherein:
R$^1$ in each occurrence is independently a substituent;
R$^2$ is H or a substituent;
m is 0, 1 or 2
n is 0, 1, 2, 3 or 4;
M is a transition metal;
L is a ligand;
y is at least 1; and
x is 0 or a positive integer;
and wherein the hole-transporting material is a polymer comprising a repeat unit of formula (III-2):

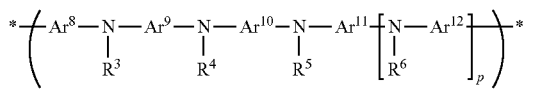

(III-2)

wherein:
Ar$^8$, Ar$^9$, Ar$^{10}$, Ar$^{11}$ and Ar$^{12}$ in each occurrence are independently fluorene or phenyl, each of which is independently unsubstituted or substituted with one or more substituents selected from C$_{1-20}$ alkyl, wherein one or more non-adjacent C atoms may be replaced with optionally substituted aryl or heteroaryl, O, S, C=O or —COO— and one or more H atoms may be replaced with F; and a crosslinkable group;

R$^3$, R$^4$, R$^5$ and R$^6$ are each independently:
an aryl or heteroaryl group Ar$^{13}$ or a branched or linear chain of Ar$^{13}$ groups, wherein each Ar$^{13}$ independently is unsubstituted or substituted with one or more substituents R$^{18}$ selected from C$_{1-20}$ alkyl wherein one or more non-adjacent C atoms may be replaced with optionally substituted aryl or heteroaryl, O, S, C=O, or —COO—, and one or more H atoms may be replaced with F;
a C$_{1-20}$ alkyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F;
a C$_{1-20}$ alkyl-phenyl group, wherein one or more non-adjacent C atoms of the C$_{1-20}$ alkyl group may be replaced with O, S, —C(=O)—, or —C(=O)O—, and one or more H atoms of the C$_{1-20}$ alkyl group may be replaced with F; or
a crosslinkable unit that is bound directly to the N atom of formula (III) or (III-2) or spaced apart therefrom by a spacer group;
wherein Ar$^9$ and Ar$^{10}$ are linked by a group of formula CR$^{19}_2$ wherein each occurrence of R$^{19}$ in the group linking Ar$^9$ and Ar$^{10}$ is independently a substituent; and
p is 0 or a positive integer.

* * * * *

UNITED STATES PATENT AND TRADEMARK OFFICE
CERTIFICATE OF CORRECTION

PATENT NO.         : 11,024,818 B2
APPLICATION NO.    : 15/532891
DATED              : June 1, 2021
INVENTOR(S)        : Simon King et al.

It is certified that error appears in the above-identified patent and that said Letters Patent is hereby corrected as shown below:

On the Title Page

Item [30]:
"Dec. 2, 2014 (GB)..................... 14211407"
Should be replaced with:
--Dec. 2, 2014 (GB)..................... 14211407.6--.

In the Claims

In Claim 1, at Column 35, Line 2, the text:
"$Ar^8, Ar^g, Ar^{10}, Ar^{11}$ and $Ar^{12}$"
Should be replaced with:
--$Ar^8, Ar^9, Ar^{10}, Ar^{11}$ and $Ar^{12}$--.

In Claim 18, at Column 37, Line 2, the text:
"$Ar^8, Ar^g, Ar^{10}, Ar^{11}$ and $Ar^{12}$"
Should be replaced with:
--$Ar^8, Ar^9, Ar^{10}, Ar^{11}$ and $Ar^{12}$--.

In Claim 19, at Column 38, Line 23, the text:
"$Ar^8, Ar^g, Ar^{10}, Ar^{11}$ and $Ar^{12}$"
Should be replaced with:
--$Ar^8, Ar^9, Ar^{10}, Ar^{11}$ and $Ar^{12}$--.

Signed and Sealed this
Third Day of September, 2024

Katherine Kelly Vidal
*Director of the United States Patent and Trademark Office*